United States Patent
Teeter et al.

(10) Patent No.: US 8,501,526 B2
(45) Date of Patent: Aug. 6, 2013

(54) SYNTHESIZING PHOTOVOLTAIC THIN FILMS OF HIGH QUALITY COPPER-ZINC-TIN ALLOY WITH AT LEAST ONE CHALCOGEN SPECIES

(75) Inventors: Glenn Teeter, Lakewood, CO (US); Hui Du, Golden, CO (US); Matthew Young, Lakewood, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 13/453,948

(22) Filed: Apr. 23, 2012

(65) Prior Publication Data

US 2012/0295396 A1    Nov. 22, 2012

Related U.S. Application Data

(60) Provisional application No. 61/453,660, filed on Apr. 22, 2011.

(51) Int. Cl.
   *H01L 21/00*    (2006.01)
(52) U.S. Cl.
   USPC ........ 438/95; 438/57; 257/436; 257/E25.009; 257/E31.029
(58) Field of Classification Search
   USPC ....... 438/57, 95; 257/436, E25.009, E31.029
   See application file for complete search history.

(56) References Cited

U.S. PATENT DOCUMENTS

| | | | |
|---|---|---|---|
| 2009/0205714 A1* | 8/2009 | Kuhnlein et al. | 136/264 |
| 2010/0248419 A1 | 9/2010 | Woodruff et al. | |
| 2011/0027940 A1 | 2/2011 | Oladeji | |
| 2012/0067408 A1* | 3/2012 | Hotz et al. | 136/255 |
| 2012/0100663 A1* | 4/2012 | Bojarczuk et al. | 438/73 |
| 2012/0115312 A1* | 5/2012 | Agrawal et al. | 438/478 |
| 2012/0138866 A1* | 6/2012 | Agrawal et al. | 252/501.1 |

FOREIGN PATENT DOCUMENTS

| | | |
|---|---|---|
| WO | 2007134843 A2 | 11/2007 |
| WO | 2010094779 | 8/2010 |
| WO | 2010135665 A1 | 11/2010 |
| WO | 2010135667 A1 | 11/2010 |

OTHER PUBLICATIONS

Guo, Q. et al., "Fabrication of 7.2% Efficient CZTSSe Solar Cells Using CZTS Nanocrystals," J. Am. Chem. Soc. 2010, 132, 17834-17386.

(Continued)

*Primary Examiner* — Jarrett Stark
*Assistant Examiner* — Nicholas Tobergte
(74) *Attorney, Agent, or Firm* — Paul J. White; J. Patrick Kendrick

(57) ABSTRACT

A method for synthesizing a thin film of copper, zinc, tin, and a chalcogen species ("CZTCh" or "CZTSS") with well-controlled properties. The method includes depositing a thin film of precursor materials, e.g., approximately stoichiometric amounts of copper (Cu), zinc (Zn), tin (Sn), and a chalcogen species (Ch). The method then involves re-crystallizing and grain growth at higher temperatures, e.g., between about 725 and 925 degrees K, and annealing the precursor film at relatively lower temperatures, e.g., between 600 and 650 degrees K. The processing of the precursor film takes place in the presence of a quasi-equilibrium vapor, e.g., Sn and chalcogen species. The quasi-equilibrium vapor is used to maintain the precursor film in a quasi-equilibrium condition to reduce and even prevent decomposition of the CZTCh and is provided at a rate to balance desorption fluxes of Sn and chalcogens.

18 Claims, 6 Drawing Sheets

(56) References Cited

OTHER PUBLICATIONS

Guo, Q. et al., "Synthesis of Cu2ZnSnS4 Nanocrystal Ink and Its Use for Solar Cells," J. Am. Chem. Soc. 2009, 131, 11672-11673.

Hautala, J, et al., "Potential p-Type Doping in Amorphous Chalcogenide Films," Journal of Non-Crystalline Solids 137 &138 (1991) 1043-1046.

Hoffman, R., "Materials for CZTS Photovoltaic Devices," The 2009 NNIN REU Research Accomplishments, 82-83.

Katagiri, H. et al., "Development of CZTS-based thin film solar cells," Thin Solid Films 517 (2009) 2455-2460.

Todorov, T. et al., "High-Efficiency Solar Cell with Earth-Abundant Liquid-Processed Absorber," Adv. Mater. 2010 22, E156-E159.

Venkataraman, S., et al., "D.c. conductivity of amorphous CuInSe2 films," Journal of Materials Science Letters 6 (1987) 1374-1376.

\* cited by examiner

SYNTHESIZING PHOTOVOLTAIC THIN FILMS OF HIGH QUALITY COPPER-ZINC-TIN ALLOY WITH AT LEAST ONE CHALCOGEN SPECIES

CROSS-REFERENCE TO RELATED APPLICATIONS

This application claims the benefit of U.S. Provisional Application No. 61/453,660 filed Apr. 22, 2011, which is incorporated herein by reference in its entirety.

CONTRACTUAL ORIGIN

The United States Government has rights in this invention under Contract No. DE-AC36-08GO28308 between the United States Department of Energy and the Alliance for Sustainable Energy, LLC; the Manager and Operator of the National Renewable Energy Laboratory.

BACKGROUND

Thin-film photovoltaic (PV) devices may be used to create solar cells, detectors, electronic devices, telecommunication devices, charge-coupled imaging devices (CCDs), computers, and even biological or medical devices (together considered "thin-film compound semiconducting materials"). With regard to renewable energy, solar cells are devices that have characteristics that enable them to convert the energy of sunlight into electric energy. The aim of research often is to achieve solar cell designs with the lowest cost per watt generated by the solar cell, and, concurrently, the designs should provide solar cells that are suitable for inexpensive commercial production.

The potential market for thin-film photovoltaic (PV) devices is enormous and is expected to continue to grow in the coming years. Recently, a goal was set to globally deploy one terawatt of continuous PV-based power, and achieving this goal will require an industry that can supply on the order of 200 gigawatt peak (GWp) of PV modules each year. Additionally, in the United States, goals concerning costs have been set that include a module-level cost goal for utility-scale PV installations of 0.5 \$/Wp, which would make unsubsidized PV competitive with conventional power sources. At this cost level and at a deployment level in the hundreds of GWp per year, PV module sales globally may be in excess of \$50 billion (in U.S. dollars) per year. As will be appreciated, any technology that can better enable the PV industry, such as by increasing efficiencies, reducing material costs, lowering manufacturing expenses, and the like, has a large potential for growth and revenue generation.

A conventional thin-film solar cell is composed of a stacking of thin layers on a substrate, in which the thin layers form one or more junctions with differing band gaps that absorb light and convert it into electricity. Presently, most compound semiconductor thin-film solar cells are fabricated with an absorber, or absorber layer formed of cadmium telluride (CdTe) or copper indium gallium diselenide (CIGS), both of which have high optical absorption coefficients and have versatile optical and electrical characteristics. The thin-film PV industry based on CdTe and CIGS recently had sales approaching \$2 billion in U.S. dollars) per year, with sales continuing to rapidly grow.

Unfortunately, there are concerns in the PV industry that reliance on CdTe and CIGS thin-film devices may not be sustainable. For example, many have expressed concern that the costs of raw materials such as tellurium and indium will increase as the PV industry continues to grow and demand for these commodities or raw materials will someday outstrip supply. When this happens, there will inevitably be upward forces on production costs that will both curtail growth of the thin-film PV industry and prevent thin-film PV from achieving the above-stated goals including a goal of 0.5 \$/Wp. Additionally, both indium and tellurium have use in non-PV-related industries that are not subject to the severe cost restraints that face thin-film PV, and these non-PV uses may generate further price pressures on these raw materials.

The concerns over the availability and cost of raw materials has caused many in the PV industry to attempt to develop thin-film PV devices that use materials that are based on abundant and less toxic elements for the thin-film layers including the absorber layer. For example, $Cu_2ZnSn(S,Se)_4$ or CZTSS is a compound semiconductor material that has recently been under investigation in the PV industry for use in thin-film PV devices. For example, CZTSS thin films are p-type and may serve as an absorber layer in thin-film solar cells in place of a thin film of CdTe or CIGS. CZTSS is structurally and chemically similar to more well-known chalcopyrite materials such as CIGS, and CZTSS displays many of the same attributes that have made CIGS a successful material for high-efficiency (i.e., greater than 20 percent efficiencies) thin-film PV devices.

In 2010, a thin-film PV device with a CZTSS absorber was fabricated with an efficiency of 9.7 percent. Such efficiency is remarkably high considering how little research has been done on CZTSS materials by the PV industry. The tested CZTSS film had several characteristics that may have lowered that achieved efficiency. For example, cross-sectional SEM images indicated that the film had a morphology that included numerous voids and that the grain size was relatively small at less than about 2 microns. While CZTSS films may someday be used commercially as an absorber in PV devices, the PV industry may demand processes for fabricating higher quality CZTSS films such as films with less voids, with selectable grain sizes (e.g., larger grains to limit losses associated with charge carriers crossing grain boundaries), and with more desirable optoelectronic properties.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

It was recognized that complex materials such as $Cu_2ZnSn(S,Se)_4$ or, more simply, CZTSS are generally difficult to synthesize due to the difficulty of precisely controlling their composition. For CZTSS, controlling composition of a thin film (e.g., an absorber of a solar cell, or the like) is made more difficult due to the fact that CZTSS decomposes at elevated temperatures (e.g., temperatures over about 600 degrees Kelvin (K)) due to the loss of both volatile compounds of tin-sulfur (Sn—S), tin-selenium (Sn—Se), elemental S, or Se.

With this in mind, a method is described for synthesizing or providing a thin film of CZTSS with well-controlled properties using a scalable two step process. Briefly, the first step involves depositing a thin film of precursor materials (e.g., approximately stoichiometric amounts of copper (Cu), zinc (Zn), tin (Sn), and sulfur (S) and/or selenium (Se)). The second step involves annealing the precursor film at high temperatures (e.g., annealing temperatures between 600 and 875 degrees K or the like) in the presence of an equilibrium vapor (e.g., Sn and a chalcogen species). The equilibrium vapor is used to maintain the precursor film in a quasi-equilibrium condition during annealing to reduce and even prevent decomposition of the CZTSS and is provided at a rate and/or amount to balance the desorption fluxes of Sn and S/Se that may result from $SnS_2$, $SnSe_2$, SnS, and/or the SnSe sublimation.

Such a two-step synthesizing process solves the problem of the loss of volatile species during deposition or processing of CZTSS at high temperatures by introducing excess Sn and S/Se-containing compounds that compensate for the loss due to thermal decomposition and sublimation. As a result, the CZTSS synthesizing process enables a commercial growth process to be designed that effectively separates the growth of high-quality CZTSS into two distinct, controllable steps. In the first step (deposition of the precursor), the relative composition of Cu and Zn are fixed, and the overall film stoichiometry may be adjusted to be close to optimal. In the second step, the thin film is processed at high temperature to achieve desired film qualities such as to grow large grains (e.g., grains that are about as thick as the thickness of the film or larger) and to optimize the film's optoelectronic properties such as by adjusting the composition relative to Sn and S and/or Se.

More particularly, a method is provided for synthesizing a thin film of CZTSS such as for use as an absorber in a photovoltaic device. The method includes providing a substrate with an absorber precursor film. Then, in a chamber, the method continues with heating the substrate to an annealing temperature. The method also includes, at least partially concurrently with the heating, providing a flux of a quasi-equilibrium vapor to the surface of the film.

The providing (or deposition) step may include depositing a thin film of material including approximately stoichiometric amounts of copper, zinc, tin, and at least one chalcogen species. In such cases, the chalcogen species may be sulfur and/or selenium. In some applications, the equilibrium vapor includes the elemental forms of tin and the chalcogen species. In other cases, though, the equilibrium vapor includes a vapor of tin chalcogenide(s). In still other cases, the equilibrium vapor is provided as a combination of: (a) the elemental form of tin; (b) the elemental form of the chalcogen species; and (c) a vapor of tin chalcogenide(s).

In the method during the heating or annealing step, desorption fluxes from the absorber precursor film may be balanced by the flux of the quasi-equilibrium vapor. In this way, a quasi-equilibrium condition is provided in the chamber to control thermal decomposition of the absorber precursor film. This equilibrium condition allows thermal processing to occur at higher temperature such as with the annealing temperature being selected from the range of 600 to 875 degrees K or the like, the upper temperature being limited primarily by the ability of the substrate and back contact materials to withstand high temperatures without degradation, such as melting of a glass substrate, or the conversion of a molybdenum back contact layer into $MoS_2$.

In another implementation or application, a method of forming a thin film for use in photovoltaic devices is provided that includes, on a substrate, depositing a precursor film comprising copper, zinc, and tin. The method then continues processing the precursor film to generate a thin film including copper, zinc, tin, and at least one chalcogen species (e.g., the chalcogen species may be provided in the precursor film and/or be provided in this or later step(s)). The method also includes, concurrently with at least a portion of the processing of the precursor film, providing a quasi-equilibrium vapor over the precursor film and the substrate, the equilibrium vapor including tin and chalcogen species.

In some uses of the method, the processing of the precursor film includes growing grains in the thin film to grain sizes greater than about a thickness of the film, and this grain growth is generally achieved by annealing the thin film at an annealing temperature greater than about 600 degrees K. The quasi-equilibrium vapor often includes the chalcogen species, which may be sulfur, selenium, or the like, as well as tin. When, for example, sulfur is used as the chalcogen species in the film and in the vapor, the equilibrium vapor may be beneficially provided at a level to maintain a partial pressure of SnS that exceeds that of SnS over CZTS and, at the same time, is less than that of any condensed Sn—S phases above or proximate to the substrate surface.

In the method, the processing of the precursor film may include the substeps of performing a tin plus chalcogen anneal at first annealing temperatures within a first temperature range and then performing a chalcogen anneal at second annealing temperatures within a second temperature range lower than the first temperature range. For example, the first temperature range may be above about 600 K while the second temperature range may be 375 to 575 degrees K. Recrystallization and grain growth may be performed at higher temperatures such as within the range of 725 to 925 degrees K. In this way, each of the steps or substeps may be performed within a few minutes (e.g., timeframes suitable to mass production of thin films for use in PV devices).

In addition to the exemplary aspects and embodiments described above, further aspects and embodiments will become apparent by reference to the drawings and by study of the following descriptions.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

DESCRIPTION

The following description is directed generally to a method of fabricating thin-film photovoltaic (PV) devices that include a layer of CZTSS. For example, a high-quality thin film of CZTSS may be provided as an absorber, or the absorber layer of a thin-film solar cell in the place of a thin film of CdTe, CIGS, or the like. CZTSS (or, more formally, $Cu_2ZnSn(S,Se)_4$) is a novel class of materials that are being investigated by the PV industry for use as an absorber layer in thin-film PV.

CZTSS is structurally and chemically similar to more well-known chalcopyrite materials such as CIGS, and CZTSS has been proven to display many of the same attributes that have made CIGS a successful material for high efficiency (i.e., greater than about 20 percent) thin-film PV devices. The method(s) described herein is particularly attractive because it allows highly efficient thin-film devices to be produced at low cost and also because the fabricated PV devices are made up of earth-abundant materials, which likely will provide relatively inexpensive material costs as the PV industry approaches terawatt production levels.

The described method is believed to provide a scalable method for synthesis of high-quality CZTSS thin films. Briefly, the method is based on deposition and then subsequent processing of thin-film precursors. The thin-film precursors may be deposited using a wide variety of well-known and/or manufacturing-friendly techniques. The subsequent processing includes thermally processing the precursor film into high quality CZTSS and may include maintaining a quasi-equilibrium condition in the processing chamber (annealing chamber) while the temperature of the substrate with the precursor film (e.g., the substrate temperature) is increased to an annealing or high temperature (such as 600 to 875 degrees K with 650 to 850 degrees K being one exemplary useful range).

The CZTSS formation step can be done rapidly and with very good control over all important film properties including composition/stoichiometry, film texture, grain size, morphology (e.g., a preset amount of voids with no or few voids being desirable in some cases), and optoelectronic properties. In many cases, the techniques used in the thin-film synthesizing method are compatible with those that are currently widely used in the thin-film PV industry for other materials, which may lead to it being adopted by those in the industry.

Figure 1:
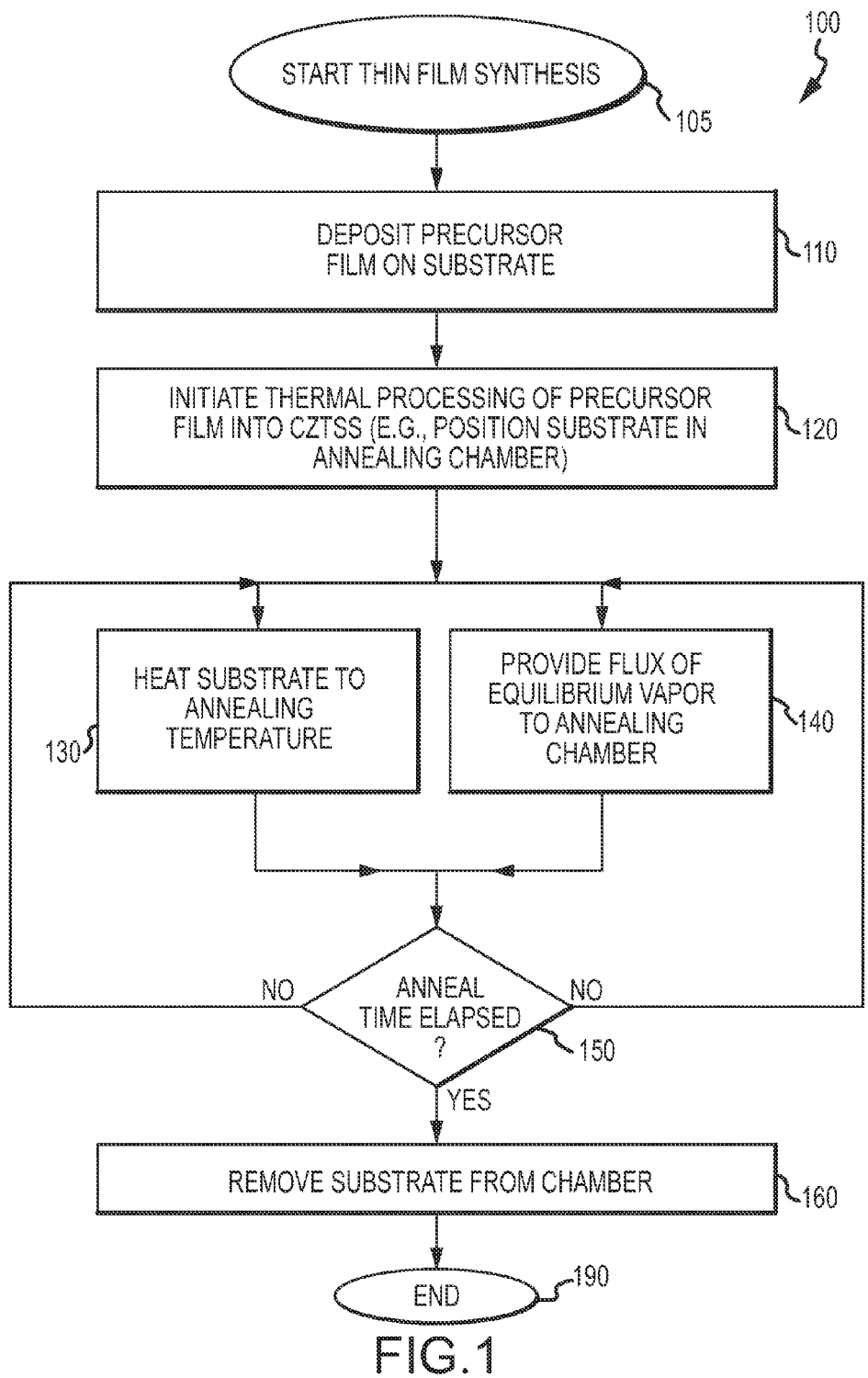
FIG. 1 is a flow diagram of a synthesis method for forming thin films of CZTSS such as may be used in PV devices.

FIG. 1 illustrates a thin-film synthesizing method 100 that is particularly useful for forming a layer of high-quality CZTSS that may be used in a PV device or in another application. The method 100 starts at 105 such as with the selection of a PV device in which a CZTSS thin film will be used, and this selection may define one or more of the parameters of the method 100. For example, in the following discussion, the use of the CZTSS thin film in PV devices such as a solar cell will be emphasized, and a CZTSS thin film may be used as an absorber in such devices. This selection at 105 may cause steps of the method 100 to be selected to grow or form a CZTSS thin film with particular characteristics such as a particular grain size and morphology. For example, it may be useful in some applications to provide large grains of CZTSS such as 3 to 6 micron grains or larger grains (or that are at least as large as the thickness of the thin film to minimize loss of charge carriers at grain boundaries), but, in other applications, smaller grains may be useful to achieve desired efficiencies (e.g., the annealing time may be shortened to increase throughput during mass production). In some cases, it may be useful to provide a morphology with few if any voids, and the method 100 may be designed to provide such a morphology. A significant aspect of the method 100 is that important film properties such as these can be controlled well such as by modifying the annealing time or temperature without concern of thermal decomposition.

At step 110, the method 100 continues with depositing a CZTSS precursor film on a substrate. As discussed above, the method 100 may be thought of as being an expanded representation of two main steps of CZTSS formation. Step 110 represents a first step in which a precursor film for CZTSS is provided on a substrate. For example, a precursor film containing stoichiometric amounts of Cu, Zn, Sn, and S, and/or Se may be deposited in step 110. The deposition step 110 may be performed using nearly any available method for depositing thin films. Depositing at 110 may involve thermal evaporation, sputtering, a solution-based deposition of the precursor thin film, or any other useful thin-film deposition technique. The two-step method 100 may also be carried out using two tools or stations in a production line, and the step 110 may be carried out in a first tool (e.g., the deposition tool or chamber (not shown)) while steps 120-150 may be carried out using a second tool or station (e.g., an annealing tool/station or thermal processing chamber or the like (also not shown)).

Figure 2:
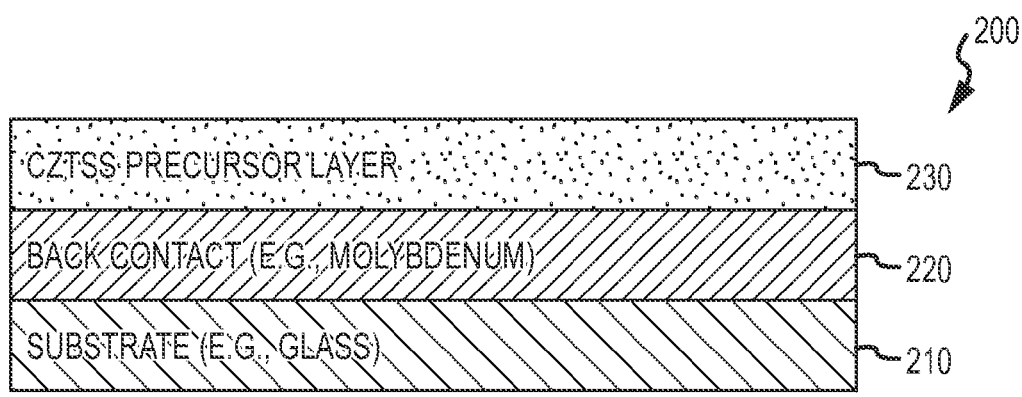
FIG. 2 illustrates a sectional view of a PV device after performance of a CZTSS precursor deposition step as part for fabricating a PV device such as a thin-film solar cell with a CZTSS absorber.
Figure 3:
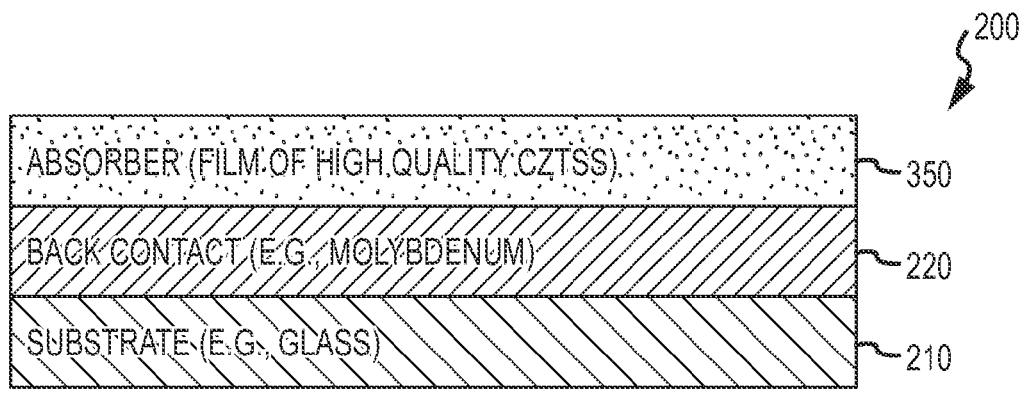
FIG. 3 illustrates a sectional view of the PV device of FIG. 2 after further thermal processing of the precursor film to form a thin film of CZTSS (e.g., that may be used as an absorber)
Figure 4:
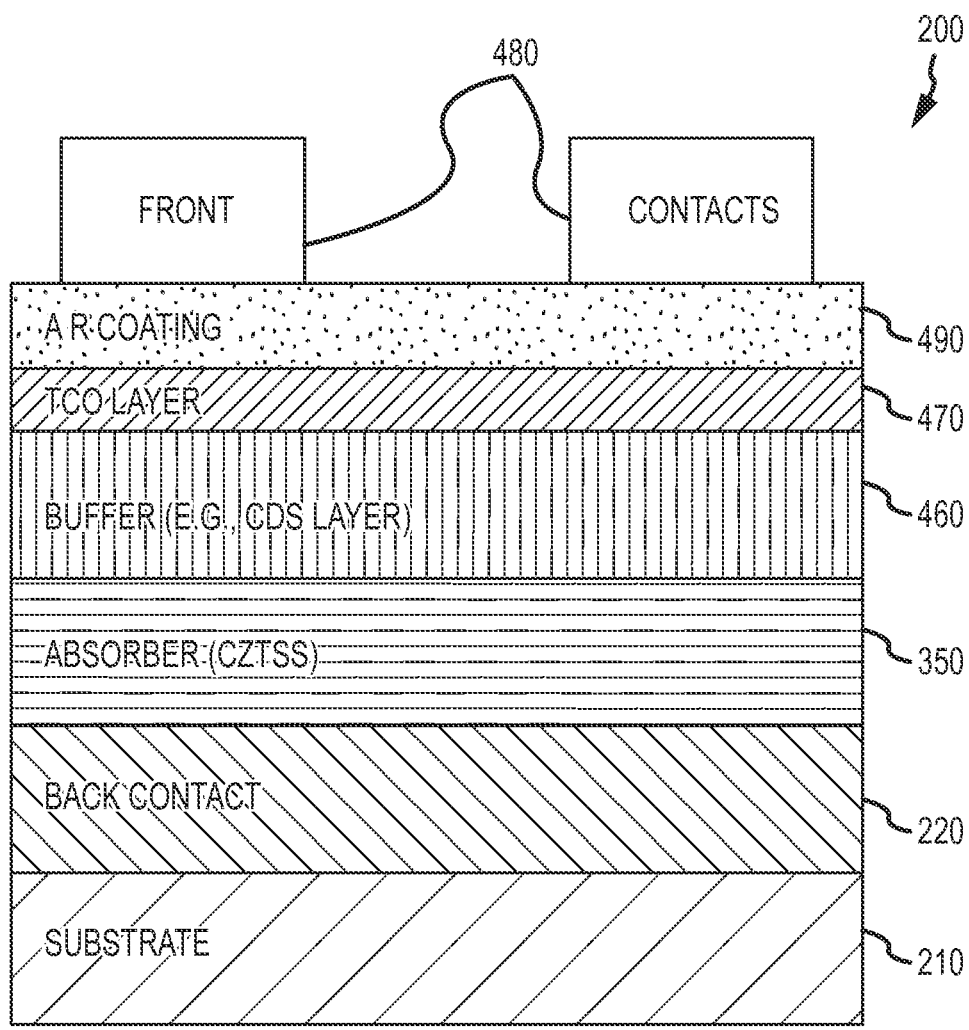
FIG. 4 illustrates a sectional view of the PV device of FIG. 3 after further processing to apply additional layers or films over the CZTSS absorber to form an exemplary thin-film solar cell.

It may be useful while describing the method 100 to also show a PV device that can be fabricated using the method 100 during stages of its fabrication. For example, the PV device may be a thin-film solar cell, and FIGS. 2-4 show fabrication of one configuration or design of such a thin-film solar cell 200. This example, though, should not be considered limiting as the CZTSS thin films may be used in nearly any PV device such that the teaching herein is broad enough to cover any PV device that includes a CZTSS thin film (such as, but not limited to, PV devices with an absorber made up of a CSTSS thin film).

FIG. 2 illustrates a PV device 200 during its initial fabrication or, more specifically, after completion of step 110. As shown, the PV device 200 includes a substrate 210 upon which a back contact 220 has been provided (e.g., deposited or otherwise formed). The substrate 210 may be a glass substrate while the back contact 220 may take the form of a layer of molybdenum. The PV device 200 is also shown to include a precursor film or CZTSS precursor layer 230 that has been deposited during step 110 onto the back contact 220 and substrate 210 (e.g., step 110 can be described as depositing CZTSS precursor material upon a substrate such as, but not limited to substrate 210).

Step 110 may involve nearly any thin-film deposition process such as a chemical deposition (such as chemical vapor deposition, chemical solution deposition, plating, or the like), a physical deposition (such as sputtering, use of a thermal evaporator, or the like), or other deposition processes (such as reactive sputtering, topotaxy, or the like). The CZTSS precursor layer typically will include stoichiometric amounts of copper, zinc, and tin as well as sulfur and/or selenium to provide materials useful in later forming (via thermal processing or annealing) a desired copper-zinc-tin alloy with at least one chalcogen species.

With reference again to FIG. 1, the method 100 then includes step 120 that involves initiating thermal processing or annealing of the precursor film 230 to form CZTSS. Step 120 may involve removing the PV device 200 of FIG. 2 from the deposition chamber/tool and positioning it within a thermal processing tool or annealing chamber, such as by positioning it upon a heater to allow controlled heating of the substrate 210 to an annealing temperature. The annealing chamber may be a sealed chamber to facilitate creation of a quasi-equilibrium condition (e.g., to limit or eliminate thermal decomposition of the CZTSS).

At step 130, the synthesis method 100 continues with heating the substrate to an annealing temperature. As discussed above, the method 100 allows higher temperatures to be utilized without losses due to thermal decomposition (such as loss of tin and/or chalcogen species). For example, the annealing temperature may be a temperature in the range of 600 to 875 degrees K, with decomposition typically initially occurring in the range of 600 to 650 degrees K and substrates such as glass melting above about 875 degrees K. Temperatures in the upper end of the specified range, or even above this range, are often desirable for allowing annealing to occur more rapidly (e.g., to keep the annealing time in the range of seconds to several minutes), and, in such cases, the temperature may be about 650 to 850 degrees K or the like. Lower temperatures may be used when more time is allowable or acceptable for performing the annealing processes (steps 120 to 150 in method 100).

In this "second step or phase" of the synthesis process (which may include processes 120 to 150 of method 100), the CZTSS precursor layer 230 is being annealed to form high-quality CZTSS. However, a basic problem associated with the deposition and thermal processing of CZTSS is that the compound tends to decompose at elevated temperatures through the liberation of tin chalcogenides (i.e., materials that are highly volatile at temperatures above about 600 to 650 degrees K). In the past, this has prevented the use of thermal processing above such temperatures or required other processes or techniques to try to address the problem (such as providing significantly larger amounts of tin in the precursor to try to account for anticipated losses).

The CZTSS thermal decomposition process proceeds according to the following formula: $Cu_2ZnSn(S,Se)_4 \rightarrow Cu_2(S,Se)$ (s)+$Zn(S,Se)$ (s)+$Sn(S,Se)_2$ (v), or alternatively in some cases, $Cu_2ZnSn(S,Se)_4 \rightarrow Cu(S,Se)$ (s)+$Zn(Sn,Se)$ (s)+$Sn(S,Se)$ (v). A consequence of this thermal decomposition process is that films processed at high temperatures tend to be Sn deficient. In turn, this leads to films that are mixtures of CZTSS, $Cu_2(S,Se)$ or $Cu(S,Se)$ and $Zn(S,Se)$ rather than pure CZTSS, which is more desirable in many PV applications. The presence of excess $Cu_2(S,Se)$ or $Cu(S,Se)$ in particular reduces film quality and PV device performance by lowering film resistivity. Similarly, sublimation of volatile Sn-chalcogenide species makes it very difficult to precisely adjust film composition, which is desired to control the resulting thin film's optoelectronic properties by, for example, adjusting the densities of intrinsic point defects.

To prevent or at least control CZTSS thermal decomposition, the method 100 includes step 140 that is performed concurrently with at least a portion of the substrate heating step 130. Step 140 involves providing a flux of a quasi-equilibrium vapor to the interior of the surface of the film (e.g., a flux of equilibrium vapor over the surface of the heated CZTSS precursor layer 230 of PV device 200). Stated differently, the film 230 is annealed in the presence of a quasi-equilibrium vapor, which may take the form of tin and a chalcogen species (such as S and/or Se). The tin (Sn) and chalcogen provided at step 140 can be in the form of elemental Sn and chalcogen, the vapor of tin chalcogenide(s) (e.g., SnS or $SnS_2$), or a combination of the two (i.e., may be defined by the formula: $xSn+ySnS+zS$, where x, y, and/or z may be zero). The chalcogen vapor may be supplied either in cracked form (e.g., $S_2$ dimers) or uncracked form (equilibrium vapor containing numerous polyatomic species $S_n$, n=2, 4, 5, ...), or as the hydrogen chalcogenide (e.g., $H_2S$).

The method 100 continues at 150 with determining whether the annealing or thermal processing time has elapsed. Again, this time will vary to practice the method 100 and may range from seconds to several minutes in typical applications. The time will vary with other processing parameters such as annealing temperatures, flux or flow rate and pressure of the equilibrium vapor, and the like. If it has not expired, the method 100 continues with steps 130 and 140. Once the time has expired, the method 100 continues at 160 with removing the substrate from the chamber 160, and the method ends at 190. After step 160, additional steps (not shown) may be taken to complete fabrication of a PV device.

Specifically, FIG. 3 shows the PV device 200 after completion of steps 130, 140, 150, and 160 (after annealing is complete). As shown, the precursor layer 230 has been annealed at high temperature for a period of time in the presence of an equilibrium vapor, and this results in formation of a layer or thin film of CZTSS 350. This film 350, as shown in FIG. 3, may provide an absorber for the PV device 200.

FIG. 4 illustrates the PV device 200 after further processing to form a CZTSS-based, thin-film solar cell. The cell or PV device 200 is shown to further include a buffer layer or film 460 (such as a thin film of cadmium sulfide, zinc sulfide, or the like) applied over the CZTSS absorber 350 to provide the junction to generate the photoelectric effect. The PV device 200 further is shown to include a transparent conducting oxide (TCO) layer 470 and an optional antireflective (AR) coating 490, which may be in the form of a thin film of a number of differing materials such as $MgF_2$, or the like. Further, the PV device 200 of FIG. 4 is processed to include front contacts 480 (e.g., fingers or a grid of aluminum, silver, copper, nickel, or the like), with the AR coating 490 often being applied over the top of both the TCO layer 470 and the front contacts 480 so as not to interfere with charge transfer.

As will be appreciated with an understanding of the method 100 and the exemplary PV device 200 of FIGS. 2-4, the methods described herein provide a scalable method for synthesis of high quality thin-film CZTSS. The method is based on deposition and subsequent processing of thin-film precursors, which can be deposited with a wide variety of manufacturing friendly techniques. The technique for thermally processing these precursor films into CZTSS can be done rapidly (with each step taking less than several minutes in most cases) and with very good control of all important film properties (e.g., composition/stoichiometry, film texture, grain size, morphology, and optoelectronic properties). Additionally, the techniques are compatible with those that are currently widely used in the thin-film PV industry for other materials.

The method described herein for CZTSS high-temperature processing inhibits thermal decomposition by balancing the desorption fluxes of Sn and S/Se that result from $Sn(S,Se)_2$ sublimation. The maintenance of a quasi-equilibrium condition by providing a quasi-equilibrium vapor to the film surface in the annealing chamber/tool allows precursor films to be processed at higher temperatures (e.g., temperatures over about 600 to 650 degrees K) to produce material that, in some embodiments, is single phase, large-grained, and strongly textured with good optoelectronic properties.

Figure 5:
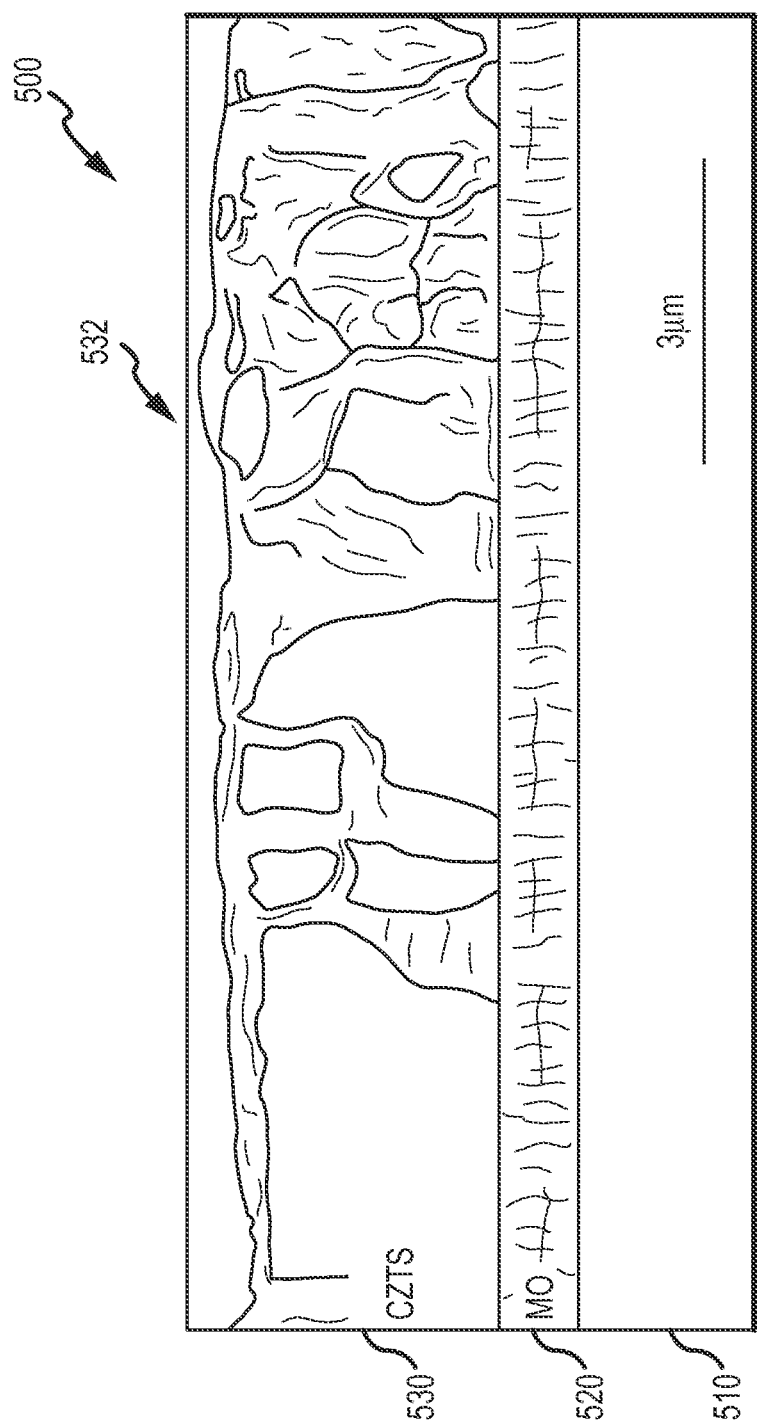
FIG. 5 is a cross-sectional SEM image of a CZTSS absorber layer prior to completion of the PV device (such as the PV device of FIG. 3) showing a superior grain structure and morphology achieved in the CZTSS film formed according to the thin-film synthesis processes described herein.

FIG. 5 illustrates a SEM image 500 of a cross section of CZTSS absorber film deposited on Mo-coated soda lime glass (prior to completion of the PV device) synthesized by one implementation of the CZTSS synthesizing processes described herein. As shown, the CZTSS film 500 includes a glass substrate 510 upon which a molybdenum film has been deposited to provide a back contact 520. Upon the molybdenum film 520, a high-quality CZTSS film 530 has been synthesized by thermally processing a precursor film in the presence of an equilibrium vapor (as discussed above). The results include larger grains or a better grain size than prior PV devices using CZTSS absorbers. Particularly, prior CZTSS films had grains of about 2 microns or less whereas the grains 532 of CZTSS film 530 are shown to be about 3 microns or larger in size. Additionally, the film 530 has a voidless morphology (i.e., a morphology substantially free of voids) whereas prior CZTSS films typically had many voids between adjacent grains.

The thin-film synthesis method described above is useful for effectively crystallizing a CZTSS precursor film to provide a high quality CZTSS film, which may be used as a PV device absorber. The crystallized CZTSS film may be large grain in that it may have grains that are 1 to a few microns in size with some embodiments of the method being used to provide grain size that is greater than about a CZTSS film thickness (or 1 to 2 times the film thickness as may be desirable to limit the number of charge carriers that cross grain boundaries to limit grain boundary recombination). Note, the two steps described above may be combined into a single-step process or to create a hybrid process based on these concepts.

Generally, the method is adapted to provide high levels of control over film properties. For example, the thermal decomposition equation may be used to determine an expected amount of desorption fluxes of Sn and S/Se, and the equilibrium vapor (with Sn and the chalcogen species) may be provided at a rate or as an amount of counterbalancing flux (a "balancing flux") to block such thermal decomposition in or from the high-temperature precursor film. Often, it may be desirable to use higher temperatures to obtain larger grain sizes in shorter times while other implementations may balance the desire for shorter processing times with costs associated with higher temperature equipment, and these implementations may allow for a longer annealing time at a lower annealing temperature.

In some cases, too, it may be allowable for the morphology to include some amount of voids and/or for grain sizes to be smaller to still achieve a useful film of CZTSS. However, typically, it may be desirable to perform the two steps of the process in a relatively short time (or at a higher production rate), and the described process allows that annealing time (Which is a function of temperature and pressure) to be relatively short as the annealing temperature can be well over 600 degrees K without (or with minimal) thermal decomposition of the CZTSS.

The thin-film synthesis method can be used to provide or achieve rapid crystallization of a precursor film in which volatile tin and chalcogen-containing species are supplied in appropriate amounts. The crystallization occurs in a way (i.e., in the presence of a quasi-equilibrium vapor) that prevents thermal decomposition of CZTSS and the loss of the volatile tin and sulfur-containing species, which would result in deterioration of film properties and the formation of secondary phases (e.g., $Cu_x(S,Se)$ and $Zn(S,Se)$).

The thin-film synthesis method is adapted to ensure that volatile metal-containing species are balanced during high-temperature processing used to convert the precursor into a PV absorber. This is useful because in prior processing techniques the metal content in a processed/formed absorber was sometimes assumed to be identical to that of the precursor, which is not true for many cases such as in the Cu—Zn—Sn—S—Se system, in CIGS processing, and the like. The synthesis method is useful for high-temperature processing of nearly any CZTSS precursor film (including one derived from an ink solution) in which the loss of Sn and (S,Se)-containing species is suppressed by the provision of compensating fluxes of these same species from the gas phase (e.g., an overpressure of SnS and/or SnSe).

The thin-film synthesis method described herein may be considered a workable and useful response to the thermal decomposition and desorption issues as it is a synthesis method based, at least in part, on the volatility of SnS and SnSe. It is expected that at typical thin-film growth or processing temperatures (sometimes referred to herein as annealing and/or thermal processing temperatures) that $Cu_x(S,Se)$ and $Zn(S,Se)$ will remain solid, whereas $Sn(S,Se)_2$ or $Sn(S,Se)$ will decompose $(Sn(S,Se)_2$ (s)→$Sn(S,Se)$ (s)+½$(S,Se)_2$ (g)) and similarly $Sn(S,Se)$ will decompose $(Sn(S,Se)$ (s)→$Sn(S,Se)$ (g)). To balance or prevent such decomposition, the thin-film synthesis method may include a first step of depositing Cu+Zn+Sn+(S,Se) on a suitable substrate at a relatively low temperature (e.g., below about 600 degrees K). The precursor film preferably will include Cu, Zn, Sn, and (S,Se) in approximately the ratios (2:1:1:4) and in the right amounts for making a polycrystalline thin-film $Cu_2ZnSn(S,Se)_4$ absorber layer (such as with a thickness in the range of 0.5 to 10 micrometers with 2 to 5 micrometers being useful in many cases). The actual ratios of Cu, Zn, Sn, and (S,Se) will be determined according to the desired properties of the absorber layer, and the ratios could include deviations from the ideal (2:1:1:4) ratios as useful for a particular application of the method. The precursor film prepared by this first step would typically be crystalline and/or amorphous as deposited and may contain some combination of any of the phases.

The second step may then be to anneal this precursor film from the first step in an atmosphere of $Sn(S,Se)$ (g) and (S,Se) (g). The source of $Sn(S,Se)$ (g) may be $Sn(S,Se)$ (s) heated to a sufficient temperature to produce the vapor pressure of $Sn(S,Se)$ (g) useful for maintaining a quasi-equilibrium condition at the surface of the film in the annealing chamber. A similar technique may be used to produce S and/or Se vapor or, alternatively, $S_2$ and/or $Se_2$ molecules may be supplied from a valve cracker-type source. In addition to $Sn(S,Se)$ and (S,Se), an inert carrier gas may be used in this annealing step to deliver these species to the precursor film as it is being thermally processed and also to limit/control re-desorption of $Sn(S,Se)$ and $S_2$ or $Se_2$ or SSe from the film. One purpose of this second step may be to allow the substrate and precursor film to be raised to a sufficiently high processing temperature to convert the precursor film into large-grained, high-quality, single-phase CZTSS without losing $Sn(S,Se)$ and S or Se from the film. Otherwise, the CZTSS film may contain excessive levels of secondary phases such as $Zn(S,Se)$ and $Cu_2(S,Se)$, which could hinder device performance.

In a high-throughput industrial process for synthesizing CZTSS, it may be beneficial to design a process for the second step (or annealing step) in which there are several separate processing regions. Each of these regions may be run at a separate temperature (or range of temperatures) and partial pressures of $Sn(S,Se)$ and/or S or Se (or fluxes of the equilibrium vapor). This would permit the substrate/film to be heated to the thermal processing temperature and subsequently can be returned to a lower temperature in steps, with each step or region having a combination of $Sn(S,Se)$, S, and Se partial pressures and a temperature that produces a quasi-equilibrium processing condition for CZTSS.

In the above description, the process of forming a CZTSS film was described as a two-step synthesizing process or method. In some preferred embodiments, though, it may be more useful to discuss the second step or annealing step as having three substeps (steps 1, 2A, 2B, and 2C) or thinking of the overall CZTSS synthesizing process as a four-step process (with the first step corresponding to precursor deposition and the last three steps corresponding to annealing and/or CZTSS formation). In other words, with regard to FIG. 1, steps 130, 140, and 150 may be replaced by (or performed by completing) Steps 2-4 described in the following paragraphs, while step 110 corresponds with Step 1.

Briefly, the four steps may be stated as follows (where "Ch" is short for chalcogen): (Step 1) $2Cu+(1+x)Zn+Sn+2Ch_2 \rightarrow Cu_2Zn_{1+x}SnCh_4$; (Step 2) $Cu_2Zn_{1+x}SnCh_4+x/2.Ch_2 \leftarrow \rightarrow 2CuCh+(1+x)ZnCh+SnCh$; (Step 3) $Cu_2Zn_{1+x}SnCh_4+ySn \leftarrow \rightarrow Cu_2Zn_{1+x}Sn_{1+y}Ch_4$; and (Step 4) $Cu_2Zn_{1+x}Sn_{1+y}Ch_4+z/2.Ch_2 \leftarrow \rightarrow Cu_2Zn_{1+x}Sn_{1+y}Ch_{4+z}$.

Step 1 involves precursor deposition in which composition is controlled to attempt to achieve a preferred ratio of metals, and, as such, the precursor deposition may or may not include sulfur (or selenium), as the chalcogen may be added in a later step. The temperature range is typically 300 to 600 degrees K, with this and other steps generally designed to be completed relatively quickly (such as less than several minutes) to support larger scale manufacturing of devices with a CZTS (or CZTSS) thin film. Step 2 may be labeled re-crystallization and grain growth and may be performed at a relatively high temperature (e.g., 825 degrees K, or even higher temperatures has proven useful) to provide fairly rapid grain growth and phase control.

Step 3 is typically performed at a somewhat lower temperature than Step 2 (e.g., 725 degrees K or the like) and involves fine tuning of the tin content such that the temperature range is selected such that tin is still volatile to allow adding or removing tin from the film. Step 3 (or "tin anneal") is used to fine tune opto-electronic properties by controlling cation-related point defects. Step 4 is then performed at an even lower temperature than Step 3 (e.g., range of 425 to 575 degrees K or the like) such that the tin is negligibly volatile (e.g., does not change the tin content over the time frame of performing Step 4). Step 4 (or "chalcogen or sulfur anneal") provides fine tuning of chalcogen content such as balancing the amount of sulfur (and/or selenium) to fill sulfur (and/or selenium) vacancies in the film's crystal lattice. In other words, Step 4 is performed to control sulfur-related point defects to enhance (or affect/define) the opto-electronic properties of the CZTSS thin film.

Figure 6:
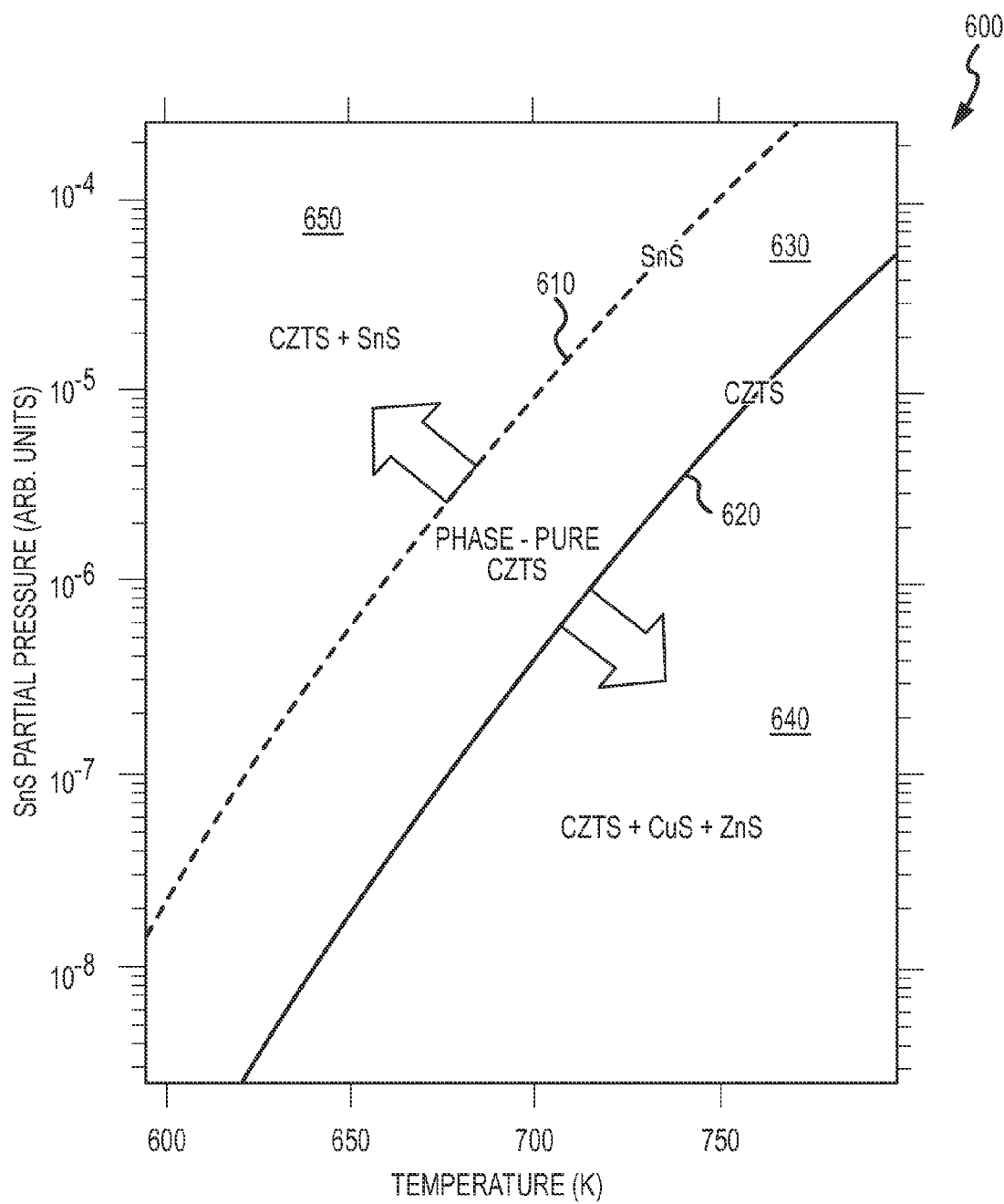
FIG. 6 is a graph schematically illustrating the stability region for CZTS growth and processing by comparing SnS partial pressures over CZTS and over condensed-phase SnS as a function of temperature.

One goal of the research and experimentation performed was to understand the vapor-phase composition and thermal decomposition pathways of thin film CZTS as a function of temperature. FIG. 6 illustrates a graph 600 showing processes occurring during the synthesizing of the CZTS film from a precursor film (e.g., Steps 2-4) showing SnS partial pressure versus temperature. In-situ thermal deposition mass spectrometry (TDMS) measurements were performed to identify vapor-phase species and also to demonstrate control over phase composition and electrically active point-defect concentrations.

As shown in FIG. 6, a region 630 where phase-pure CZTS is formed during Steps 2-4 by maintaining SnS partial pressures between the vapor pressure of pure SnS (shown with curve 610) and the vapor pressure of CZTS (shown with curve 620). At a particular temperature, lower equilibrium vapor pressures may result in formation of CuS and/or ZnS as shown in region 640 while higher equilibrium vapor pressures may result in formation of SnS as shown in region 650 of the graph 600. In test cases, it was found via TDMS measurements that SnS sublimation and/or CZTS decomposition occurs if equilibrium pressures are allowed to enter region 640 (dip below the CZTS curve 620 at any particular temperature). Hence, it is desirable to provide the quasi-equilibrium vapor at a rate at any particular temperature that maintains the vapor pressure between the partial pressures of SnS and CZTS (e.g., in the region 630 of graph 600 between or on curves 610 and 620).

Based on these findings, it is believed that to grow or thermally process materials at high rates without sacrificing quality that it is desirable to utilize high processing temperatures (as shown in graph 600). Quality may be measured by composition, crystallinity and crystalline phases that are present, grain size, morphology, and opto-electronic properties. Higher growth temperatures (e.g., greater than 600 degrees K or the like) are desired so that processes such as interdiffusion and grain growth are not rate limited. Desorption fluxes of volatile species can be balanced during high-temperature growth to limit loss of volatile species that lead to secondary phase formation and poorer opto-electronic properties.

At this point, it may be useful to discuss each of the four steps (Steps 1-4) in more detail. In the following discussion, "Ch" (for chalcogen) is used as shorthand for any combination of the chalcogen elements (O, S, Se, Te, etc.) and "CZTCh" (or CZTSS) is used as shorthand for any alloys with chemical formulas of $Cu_2ZnSnCh_4$. It will be understood that alloy compounds can be formed by varying chalcogen ratios, obeying the rule that the total number of chalcogen atoms equals the total number of metal atoms.

Referring now to Step 1, precursor deposition is performed typically with non-equilibrium growth conditions, e.g., Zn-rich conditions. Step 1 may be defined as $2Cu+(1+x)Zn+Sn+2Ch_2 \rightarrow Cu_2Zn_{1+x}SnCh_4$, with it being understood that "x" is typically a positive number less than 1 but "x" could also be negative in some cases. The purpose of this step is to form the precursor film. Precursor films can be deposited by any of the standard processes used for thin-film deposition including, but not limited to, co-evaporation, sputtering, electrodeposition, atomic-layer deposit, chemical-vapor deposition, liquid- or ink-based processes, chemical-bath deposition, spray pyrolysis, and/or the like.

The precursor film can contain all elements that will be included in the final CZTSS film (e.g., Cu, Zn, Sn, S, Se, and so on) or only a subset of these, such as only the metals (Cu, Zn, and Sn), or a subset of these metals (Cu and Zn). Typically, all of the Cu and Zn that will be incorporated into the final film will be deposited during Step 1, and the final ratios of these elements will be determined at this point. On the other hand, it might be desirable to add small amounts of Zn or Cu in a later process step in order to optimize surface or interface properties.

The precursor film can be deposited at substrate temperatures typically in the range of 300 degrees K<T<600 degrees K. At these temperatures, when the precursor film is deposited via a physical-vapor deposition method such as co-evaporation or sputtering, the sticking coefficients for the metals (Cu, Zn, and Sn) will be unity when deposited in the presence of sufficient chalcogen(s) ("sufficient" in this context implies that the net sulfur flux (atoms/cm$^2$s) is greater than about twice the net flux of all metals). This is because CZTCh and all related binary and ternary compounds (Cu—Ch, Zn—Ch, Sn—Ch, and Cu—Sn—Ch compounds) have low pressures at these temperatures. Also, under these growth conditions, the overall chalcogen content in the film will be such that there is about one chalcogen atom per metal atom, due to the high vapor pressures of elemental chalcogens.

With some of the heavier chalcogens (Se and Te), it might be necessary or desirable to deposit the precursor film at somewhat higher temperatures (e.g., up to about 450 degrees K) to prevent or at least limit the accumulation of excess chalcogen due to the lower vapor pressures of these compared to S and O. If the precursor is deposited without chalcogen(s) or under chalcogen-deficient conditions, the sticking coefficient of Zn could be less than one due to the high vapor pressure of elemental Zn. For this reason, it typically is useful, but not mandatory, to deposit the precursor film in the presence of sufficient chalcogen(s) to achieve a metal to chalcogen ratio of about 1.

Depending on the details of the PV device application, the overall thickness of the final CZTCh film will be on the order of 0.5 micron to 3.5 microns thick. The precursor will be of comparable thickness if it contains all of the elements that will be present in the final film and on the order of half this thickness if it contains no chalcogen but all of the metals constituents. Film composition immediately following Step 1 can be monitored with an in situ technique such as x-ray fluorescence or spectroscopic ellipsometry.

Now, with regard to Step 2, re-crystallization and grain growth is performed or achieved under quasi-equilibrium conditions. Step 2 may be defined as $Cu_2Zn_{1+x}SnCh_4+x/2.Ch_2 \leftarrow \rightarrow 2CuCh+(1+x)ZnCh+SnCh$, with "x" typically being a positive number less than 1 but "x" could also be negative in some cases. The purpose of Step 2 is to diffuse if necessary depending on precursor composition and structure) and react film constituents, and crystallize (and/or re-crystallize or grow the grains) of the precursor film. Preferably, crystallization and grain growth are achieved without allowing the film to decompose into secondary phases and without depositing a high-vapor-pressure secondary phase such as SnCh or elemental chalcogen on the surface of the film.

In a high-volume manufacturing environment, it is also desirable to perform this process at a sufficiently high temperature that diffusion, reaction, crystallization, and/or grain growth proceed sufficiently rapidly so that the process step can be completed on a timescale of minutes or less. For the sulfide CZTS, for example, these processes are sufficiently rapid over the temperature range of 725 to 925 degrees K, and it is expected that other chalcogen compositions will share similar temperature ranges. Nevertheless, the optimal temperature for Step 2 will depend on a number of factors including precursor-film composition, thickness, and structure as well as the desired depth composition profile for the completed film. It is also desirable from an industrial processing perspective to ramp the substrate from its initial temperature to the Step 2 annealing temperature as rapidly as possible as consistent with maintaining and controlling the combination of process parameters defined below.

The process parameters/considerations for achieving the goals outlined above are two-fold. First, it is useful to adjust and maintain process conditions (primarily substrate temperature and ramp rates, and Sn and chalcogen fluxes). For example, whenever the film temperature is high enough for film decomposition to proceed at a sufficient rate to change the film properties over the time scale of the process step (typically minutes or less), the fluxes (quasi-equilibrium vapor) of Sn and chalcogens (in the form of elemental Sn, O, S, Se, and so on and/or binary molecular species such as SnS, SnSe, and the like) are supplied to the film so as to exceed the rates of Sn and chalcogen desorption that accompany film decomposition (for the sulfide CZTS, for example, decomposition is rapid at temperatures above about 575 to 600 degrees K).

Second, at the same time, it is useful to keep the net flux of Sn and chalcogen species low enough so as to not exceed the vaporization rate of the binary compound(s) SnCh or of the elemental chalcogen species. So long as these conditions are maintained, the film being synthesized/formed will neither decompose nor will high-vapor-pressure secondary phases form on or in the film. All of this implies that there will be a range of Sn plus chalcogen fluxes (equilibrium vapor) that can be supplied to the film that will prevent or control formation of secondary phases. The precise nature of the resulting film properties will depend on the values that are chosen, but it is typically desirable that in Step 2 to choose parameters to prevent or at least limit film decomposition and formation of high-vapor pressure secondary phases.

The net Sn flux (in the form of elemental Sn and/or SnCh species or another Sn-containing vapor-phase species such as a metallorganic or inorganic compound with a high vapor pressure that can decompose at the film surface to supply Sn) that will be supplied during Step 2 at the final annealing temperature will typically be on the order of 5-25 Å/s. However, the rate could be higher or lower depending on the anneal temperature and time that is chosen for the process step. In general, higher annealing temperatures will lead to the use of higher Sn fluxes to achieve a high quality film. Hit is observed that the film decomposes during Step 2 (either with an in situ monitoring technique such as spectroscopic ellipsometry or based on ex situ measurements made after the process has been completed), it can be concluded that the Sn flux was insufficient for the annealing temperature that was chosen, either during Step 2 or a subsequent process step. On the other hand, if SnCh or another Sn-containing compound is deposited on or in the film, it can be concluded that the flux of Sn was in excess, either during Step 2 or subsequently.

In some embodiments or implementations, the net chalcogen flux exceeds, generally by a factor of 3 to 10, the flux of Sn in the equilibrium vapor. The overpressure of chalcogen(s) that is supplied depends on a number of factors including the substrate temperature, net flux of Sn, the chemical form of the chalcogen (e.g., $S_2$ molecules versus larger sulfur clusters), the number of different chalcogen species that are being incorporated into the film, and the desired final composition and composition profile of chalcogen species in the completed film.

The overpressure of chalcogen will accomplish two things. First, it minimizes or at least reduces the loss of chalcogen from the film at elevated temperatures. Second, it reacts with any excess Sn that is present at the film surface to form SnCh, which in turn desorbs from the film according to the quasi-equilibrium conditions that have been established. If chalcogen is supplied in excess, it may be observed that elemental (e.g., S, Se, and so on) or alloyed (e.g., chalcogen phases form on or in the film. If the chalcogen flux is insufficient in the equilibrium vapor, it might be observed that elemental Sn is deposited on or in the film and/or that the film properties (minority-carrier lifetime, carrier concentration (doping level and type), or other properties) are not optimal due to a high concentration of chalcogen vacancies and/or metal interstitial or other point defects.

In order to simultaneously maintain desired film fabrication conditions, it may be useful to simultaneously ramp substrate temperature and Sn flux to the film surface (with the chalcogen flux typically being held constant during this process step but this is not mandatory) so that the film is maintained in quasi-equilibrium with respect to Sn content at all times (e.g., stay within region 630 in graph 600) Alternatively, it may be desirable to abruptly increase the flux of Sn to the substrate at a pre-determined temperature during the ramp to the annealing temperature. This pre-determined temperature can be chosen to coincide with the transition from a state where the film composition is stable over the time scale of minutes, or longer, to states where decomposition begins to proceed at rates sufficient to change film composition over the timescale of minutes or shorter.

For example, for sulfide CZTS, this transition occurs over a temperature range of about 575 to 600 degrees K. It is possible that by providing an abrupt increase of Sn flux to the substrate that a high-vapor pressure secondary phase SnCh will transiently form on the surface. This is typically not a cause for concern, as it will soon desorb as the substrate temperature continues to increase to the final annealing temperature, so long as the transient presence of the secondary phase at the surface does not have a negative impact on, for example, film morphology. If this is the case, the temperature set point for abruptly increasing the Sn flux can be raised to a point where the transient accumulation of the high-vapor secondary phase at the surface is minimized or eliminated. The temperature set point that is ultimately chosen will depend strongly on the temperature ramp rate; in general, lower temperatures will be chosen for lower ramp rates.

In practice, ZnCh secondary phases may form during Step 1 and/or Step 2 if the Zn/Cu ratio chosen for the precursor is sufficiently high. Depending on the amount and location in the film of ZnCh phases, these might be benign or even helpful for material quality and PV device performance. Isolated grains of ZnCh might not have a detrimental effect on film properties, and ZnCh segregated at grain boundaries could provide a passivation effect that enhances minority-carrier lifetime. On the other hand, these low-vapor pressure secondary phases could be harmful to film quality or properties if present at levels that are too high or if they are in the wrong place in the film stack that makes up the photovoltaic device. For example, it is probably undesirable to have a continuous layer of ZnCh between the CZTCh and the metallic back contact, where it could impede current flow.

Film composition, optical properties, morphology, and other film characteristics, during and/or following Step 2 can be monitored with some combination of in situ characterization methods such as x-ray fluorescence, spectroscopic reflectometry, spectroscopic ellipsometry, photoluminescence, time-resolved photoluminescence, and the like.

Step 3 is performed to control cation-related point defects in the CTZSS film under quasi-equilibrium conditions. Step 3 may be defined as $Cu_2Zn_{1+x}SnCh_4 + ySn \leftarrow\rightarrow Cu_2Zn_{1+x}Sn_{1+y}Ch_4$, where typically $-0.1 < y < 0.1$. One purpose of this step is to achieve process conditions that dynamically control and adjust the net amount of Sn in the film, which will have important effects on the critical opto-electronic properties of the final film (e.g., minority-carrier lifetime, carrier concentration, and the like). To achieve the optimal or a desired level of Sn in the final film, it is useful to lower both the substrate temperature and the Sn flux (as well as possibly the chalcogen flux) from the Step-2 values. For example, the substrate temperature may be lowered to a temperature at which Sn gain or loss proceeds at a sufficient rate to equilibrate to the desired final composition, with respect to Sn, in a short amount of time (typically minutes) but not so quickly that it is difficult to control this process step and terminate it once it has been completed.

For sulfide CZTS, for example, the appropriate temperature for this process or Step 3 will typically be in the range from about 600 to about 650 degrees K. The temperature that is chosen for Step 3 can depend on film composition and structure. For example, it might be desirable to produce a film in which chalcogen composition with respect to depth is graded in order to control the spatial variation of optical bandgap, carrier concentration (doping level and type), and other film properties.

The ramp rate for the change in temperature between Steps 2 and 3 will typically be chosen to be as fast as possible or practical for a manufacturing setting. However, the ramp rate generally is not so fast that it is difficult to maintain the quasi-equilibrium process conditions that are described for Step 2 above. Also, it is worth noting that slower ramp rates than the fastest possible might be desirable in order to anneal out certain point defects or point-defect complexes that tend to exist in the material in higher concentrations at higher temperatures. Excessively fast quenching from high temperature could tend to "freeze in" undesirable levels of point defects.

During the temperature ramp from Step 2 to step 3, it is desirable to prevent or limit both film decomposition and deposition of high-vapor-pressure secondary phases (SnCh or elemental chalcogens), according to the consideration outlined in Step 2. During the ramp to the Step 3 anneal temperature, the process may be controlled to simultaneously change temperature and (either gradually or abruptly) the flux of Sn (and possibly the chalcogen) species without inducing unwanted changes in film composition or morphology.

The flux of Sn that will be supplied during Step 3 will typically be in the range from 0.5-2.5 Å/s, although higher or lower values are possible. Generally, the flux of Sn provided will be larger at higher substrate temperatures. The considerations for determining the optimal or a useful Sn flux for a given Step 3 anneal temperature include those outlined for Step 2, namely, film decomposition indicates Sn flux is insufficient, and the accumulation of Sn-containing species on or in the film indicates of excess of Sn. In addition, the Sn flux for Step 3 may be chosen to produce better or desired distribution of point-defects and point-defect complexes in the material, which in turn controls critical film properties that could include carrier concentration and minority-carrier lifetime. For example, a Sn-deficient film could lead to high levels of $CuZ_n$ antisite defects. These intrinsic point defects are believed to act as acceptors and, if present at excessive levels, could lead to degenerate p-type doping that would degrade PV device performance.

Film composition, optical properties, morphology, and the like, during and/or following Step 3 can be monitored with some combination of in situ characterization methods such as x-ray fluorescence, spectroscopic reflectometry, spectroscopic ellipsometry, photoluminescence, time-resolved photoluminescence, and the like.

Step 4 is performed to control chalcogen-related point defects in the produced CZTSS film, and it is typically performed under quasi-equilibrium conditions. This step may be defined as $Cu_2Zn_{1+x}Sn_{1+y}Ch_4 + z/2 \cdot Ch_2 \leftarrow\rightarrow Cu_2Zn_{1+x}Sn_{1+y}Ch_{4+z}$, where, typically, $-0.2 < z < 0.2$. Step 4 is designed and performed to: (1) allow unwanted composition variations with respect to the metal constituents through the depth of the film to diffuse and equilibrate and (2) adjust and optimize (at least control) the amount and distribution of chalcogen species in the film. It is possible that process conditions could be chosen to accomplish these goals simultaneously. On the other hand, it might be advantageous to do these sequentially, e.g., perform a Step 4a for cation diffusion and then a Step 4b for chalcogen-content control.

The Step 4 anneal temperature can be chosen such that diffusivities (both for cation and chalcogen species) will be sufficiently high that the film composition through the depth can equilibrate in a short time, on the order of minutes, or less if possible. It could be that different species will diffuse at substantially different rates at a particular temperature, and this could provide a motivation for dividing Step 4 into two or more substeps as described above. Diffusion is expected to proceed sufficiently rapidly in sulfide CZTS, for example, in the temperature range from about 375 to 575 degrees K.

The substrate is typically ramped from the Step 3 anneal temperature to the Step 4 anneal temperature as rapidly as possible (or practical for a particular manufacturing application). As in previous steps, it is beneficial to simultaneously adjust the Sn flux, either gradually or abruptly, to control or even prevent both significant loss of Sn from the film and accumulation of an unwanted Sn-containing species on or in the film. To achieve this when transitioning from Step 3 to Step 4, the Sn flux will be dropped to zero in the temperature range where the desorption rate of high-vapor-pressure SnCh species is low, typically on the order of 0.1 to 0.5 Å/s. During this transition, the temperature ramp can be controlled to be on the order of 0.5 to 1.0 K/s or higher in order to ensure that film composition does not change to a significant degree.

After the film temperature has dropped to a level where the Sn loss is negligible and the Sn flux at the surface of the film has been lowered to zero, the film temperature can be stabilized at a temperature where diffusion proceeds at a sufficiently rapid pace. The distribution of chalcogen fluxes will be adjusted and set at levels sufficiently high to optimize film properties or achieve desired film properties. Generally, higher chalcogen fluxes at a given temperature result in fewer chalcogen vacancies in the film. An optimal (or a desired) combination of anneal temperature, time, chalcogen fluxes will produce films with optimal (or desired/design) values of minority carrier lifetime, carrier concentration, electron and hole mobilities, and the like. The appearance of elemental (e.g., S, Se, and so on) or alloy (e.g. $S_{1-x}Se_x$) chalcogen phases on or in the film indicates that excess chalcogen has been supplied during Step 4 or a previous process step.

Prior to or during Step 4, it might be advantageous to optimize or adjust the surface properties of the film in order to provide better band offset with the buffer layer or heterojunction partner material that will be deposited in a subsequent step of forming the PV device structure. For example, it might be helpful to remove by sputtering, chemical etching, or another method, a thin near-surface layer that has a non-ideal composition. In addition, or alternatively, it might be worthwhile to add a thin layer to the surface, e.g., to create a thin Zn-rich layer: For example, it has been observed that Zn-rich and Cu-poor surface compositions of CZTCh (Ch=S, Se) induce band-bending at the surface that could benefit conduction band alignment in CZTCh/CdS device structures, which in turn improves device performance. In addition, the processing condition in Step 3 tends to produce Sn-rich surface compositions in CZTCh, which might be harmful for device performance. Therefore, depending on the details of the device architecture materials, the surface composition can be adjusted before, during, or after Step 4.

Film composition, optical properties, and morphology, etc., during and/or following Step 4 can be monitored with some combination of in situ characterization methods such as x-ray fluorescence, spectroscopic reflectometry, spectroscopic ellipsometry, photoluminescence, time-resolved photoluminescence, and the like.

After Step 4 has been completed, the substrate is cooled to a lower temperature prior to further processing (e.g., use of the substrate to form a PV cell, or other device). The combination of ramp rate and dwell times at intermediate temperatures can be chosen to optimize or control film properties with respect to point-defect concentrations. Higher levels of point defects and point-defect complexes will exist at elevated temperatures, and it will sometimes be desirable to control the ramp to room temperature in order to anneal out harmful point defects to the extent possible. It is also possible that certain point defects or complexes will be beneficial, and it is possible that these could be retained by quenching the temperature rapidly over a particular temperature range.

With the four steps of the CZTSS film understood, it may be useful to briefly discuss the inclusion of extrinsic dopants and/or passivating agents (e.g. Na, Cl, H, and the like) in the film. Generally, it is beneficial to incorporate certain elements (typically at relatively low concentrations) into the CZTCh film to optimize or adjust particular material properties and enhance PV device performance. For example, certain species such as Na might help to passivate grain boundaries and, thereby, enhance minority-carrier lifetime and charge collection in the device. It is also possible that Na or other materials could act as an extrinsic dopant to control carrier concentration (doping level and type). If needed or desired, these extrinsic dopants and/or passivating agents can be incorporated into the process described herein.

For example, certain extrinsic additives could be supplied from the substrate via diffusion during the high-temperature processing step. An example could be diffusion of Na from a soda-lime glass substrate. It would also be possible to deposit a thin layer containing an extrinsic additive onto the substrate prior to Step 1, again for subsequent diffusion during the high-temperature steps. Another method would be to incorporate the extrinsic additives into the precursor film, and it would be possible to deliver extrinsic additives to the film surface for diffusion through the film during one of the higher temperature steps (Steps 2-4) via a gas phase species (e.g., $ZnCl_2$, $S_2Cl_2$, $H_2$, atomic H, and the like). The type of extrinsic additive and delivery method can be chosen to optimize material properties and straightforwardly incorporate them into the process described herein.

Figure 7:
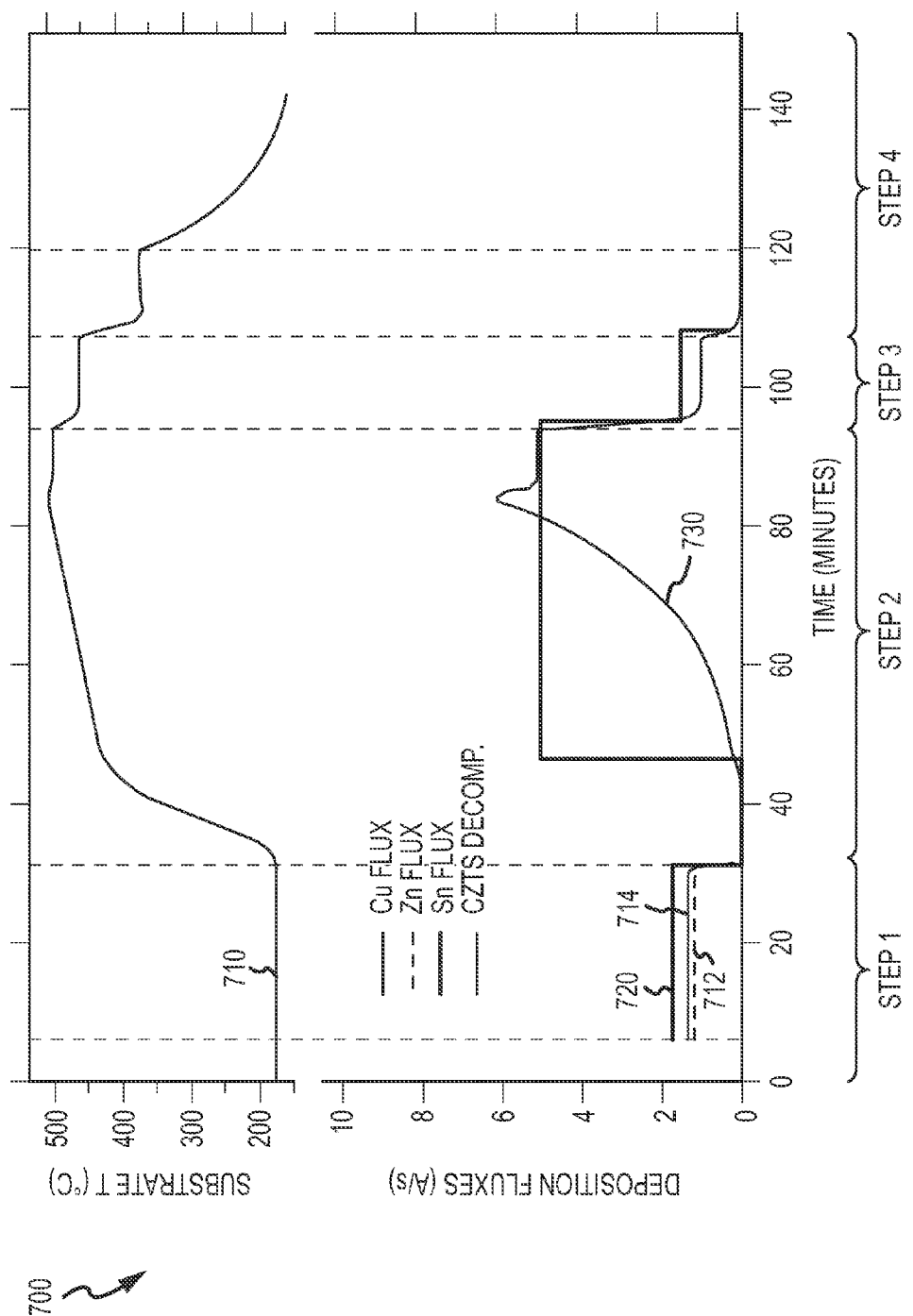
FIG. 7 is a graph showing deposition fluxes and substrate temperatures over time during the performance of one exemplary CZTS synthesizing process (e.g., a 4-step process).

FIG. 7 illustrates a graph 700 showing substrate temperature and deposition fluxes over time (or over Steps 1-4 for one implementation of the four-step process described above). Curve 710 shows the substrate temperature over time with the temperature being relatively low during Step 1 (e.g., 100° C.) and then ramping up during Step 2 to be between about 400 and 500° C. for much of the grain growth and crystallization process. The substrate temperature is then reduced to about 450° C. for tin annealing or Step 3 and then further reduced in temperature to about 350° C. for control of the sulfur or chalcogen amount in the film, thereafter being cooled in a controlled manner to room temperature.

The deposition fluxes are shown with curve 712 representing a rate for Zn and curve 714 representing rate for Cu, which are both provided during deposition of the precursor and then halted at the end of Step 1, Curve 720 represents the Sn flux, which is provided during precursor deposition and also as part of the equilibrium vapor during Steps 2 and 3. Sulfur and/or other chalcogens may be provided during Step 1 to be deposited in the precursor film and throughout in the equilibrium vapor (although not shown S, for example, may be provided at a relatively constant rate throughout the CZTCh film fabrication process). Curve 730 represents CZTS decomposition, which increased during Step 2 such that the rate of the Sn flux (as shown with curve 720) also is increased to control this decomposition and obtain a high quality CZTS film. As the Sn becomes less volatile in Step 3, the Sn flux rate as shown by curve 720 can be significantly reduced until it is halted in Step 4 with even further lowering of the substrate temperature.

While a number of exemplary aspects and embodiments have been discussed above, those of skill in the art will recognize certain modifications, permutations, additions, and sub-combinations thereof. It is therefore intended that the following appended claims and claims hereafter introduced are interpreted to include modifications, permutations, additions, and sub-combinations to the exemplary aspects and embodiments discussed above as are within their true spirit and scope.

The invention claimed is:

1. A method of synthesizing a thin film for use as an absorber in a photovoltaic device, comprising:
providing a substrate with an absorber precursor film;
in a chamber, heating the substrate to an annealing temperature; and
at least partially concurrently with the heating, providing a flux of a quasi-equilibrium vapor to a surface of the film during processing in the chamber;
wherein, during the heating, desorption fluxes from the absorber precursor film are balanced by the flux of the quasi-equilibrium vapor, whereby a quasi-equilibrium condition is provided at the surface of the film in the chamber to control thermal decomposition of the absorber precursor film.

2. The method of claim 1, wherein the providing step comprises depositing a thin film of material including stoichiometric amounts of copper, zinc, tin, and at least one chalcogen species.

3. The method of claim 2, wherein the at least one chalcogen species is selected from the group consisting of oxygen, sulfur, selenium, and tellurium.

4. The method of claim 2, wherein the quasi-equilibrium vapor comprises tin and the at least one chalcogen species.

5. The method of claim 4, wherein the quasi-equilibrium vapor comprises the elemental form of tin and the at least one chalcogen species.

6. A method of synthesizing a thin film for use as an absorber in a photovoltaic device, comprising:
providing a substrate with an absorber precursor film;
in a chamber, heating the substrate to an annealing temperature; and
at least partially concurrently with the heating, providing a flux of a quasi-equilibrium vapor to a surface of the film during processing in the chamber;
wherein the providing step comprises depositing a thin film of material including stoichiometric amounts of copper, zinc, tin, and at least one chalcogen species;
wherein the quasi-equilibrium vapor comprises tin and the at least one chalcogen species;
wherein the quasi-equilibrium vapor comprises a vapor of tin chalcogenide(s).

7. A method of synthesizing a thin film for use as an absorber in a photovoltaic device, comprising:
providing a substrate with an absorber precursor film;
in a chamber, heating the substrate to an annealing temperature; and
at least partially concurrently with the heating, providing a flux of a quasi-equilibrium vapor to a surface of the film during processing in the chamber;
wherein the providing step comprises depositing a thin film of material including stoichiometric amounts of copper, zinc, tin, and at least one chalcogen species;
wherein the quasi-equilibrium vapor comprises tin and the at least one chalcogen species;
wherein the quasi-equilibrium vapor comprises a combination of: (a) the elemental form of tin; (b) the elemental form of the at least one chalcogen species; (c) a vapor of tin chalcogenide(s); and (d) a vapor from an organometallic or inorganic Sn-containing compound.

8. The method of claim 1, wherein the annealing temperature is at least 600 K.

9. A method of forming a thin film for use in photovoltaic devices, comprising:
on a substrate, depositing a precursor film comprising copper, zinc, and tin;
processing the precursor film to generate a thin film comprising copper, zinc, tin, and at least one chalcogen species; and
concurrently with at least a portion of the processing of the precursor film, providing a quasi-equilibrium vapor over the precursor film and the substrate, the quasi-equilibrium vapor including tin;
wherein the processing of the precursor film comprises growing grains in the thin film with a grain size greater than about a thickness of the precursor film and, after the growing, annealing the thin film at an annealing temperature greater than about 600 degrees K.

10. The method of claim 9, wherein the quasi-equilibrium vapor further comprises the at least one chalcogen species.

11. The method of claim 9, wherein the quasi-equilibrium vapor is provided at a rate to maintain a vapor pressure between the partial pressures of SnCh and CZTCh.

12. A method of forming a thin film for use in photovoltaic devices, comprising:
on a substrate, depositing a precursor film comprising copper, zinc, and tin;
processing the precursor film to generate a thin film comprising copper, zinc, tin, and at least one chalcogen species; and
concurrently with at least a portion of the processing of the precursor film, providing a quasi-equilibrium vapor over the precursor film and the substrate, the quasi-equilibrium vapor including tin;
wherein the processing of the precursor film comprises performing a tin and chalcogen anneal at first annealing temperatures within a first temperature range and then performing a chalcogen anneal at second annealing temperatures within a second temperature range lower than the first temperature range.

13. The method of claim 12, wherein the first temperature range is about 600 to 925 degrees K.

14. The method of claim 12, wherein the second temperature range is about 375 to about 575 degrees K.

15. A method of synthesizing a CZTCh thin film, comprising:
providing a substrate with a surface having a precursor film comprising copper, zinc, and tin or comprising copper and zinc;
heating the substrate to a first temperature to cause recrystallization and grain growth in the film on the substrate;
at a second temperature, annealing the film on the substrate to control cation-related point defects by adjusting an amount of tin in the annealed film;
at a third temperature at which the tin in the annealed film has negligible volatility, processing the annealed film to optimize the CZTCh thin film on the substrate by adjusting an amount and distribution of a chalcogen species in the CZTCh thin film; and
concurrently with at least portions of the heating, the annealing, and the processing, providing a flux of a quasi-equilibrium vapor to the surface of the substrate.

16. The method of claim 15, wherein the quasi-equilibrium vapor is provided at a flux to maintain a vapor pressure less than partial pressures of SnCh and greater than partial pressures of CZTS proximate to the surface of the substrate.

17. The method of claim 15, wherein the first temperature is approximately in the range of 725 to 925 degrees K, the second temperature is approximately in the range of 600 to 650 degrees K, and the third temperature is approximately in the range of 375 to 575 degrees K.

18. The method of claim 15, wherein the providing of the substrate comprises depositing the precursor film with stoichiometric amounts of the copper, the zinc, the tin, and the chalcogen species and further wherein the chalcogen species includes at least one of sulfur and selenium.

* * * * *